(12) United States Patent
Huang et al.

(10) Patent No.: US 6,307,257 B1
(45) Date of Patent: Oct. 23, 2001

(54) DUAL-CHIP INTEGRATED CIRCUIT PACKAGE WITH A CHIP-DIE PAD FORMED FROM LEADFRAME LEADS

(75) Inventors: Chien-Ping Huang, Hsinchu Hsien; Lian-Cherng Chiang, Taichung; Wen-Ta Tsai, Taichung Hsien, all of (TW)

(73) Assignee: Siliconware Precision Industries, Co., Ltd., Taichung (TW)

( * ) Notice: Subject to any disclaimer, the term of this patent is extended or adjusted under 35 U.S.C. 154(b) by 0 days.

(21) Appl. No.: 09/473,310

(22) Filed: Dec. 28, 1999

(30) Foreign Application Priority Data

May 14, 1999 (TW) ................................. 88107817

(51) Int. Cl.[7] ................................................ H01L 23/495
(52) U.S. Cl. ......................... 257/676; 257/666; 257/777; 257/724
(58) Field of Search ................................ 257/666, 676, 257/777, 723, 686

(56) References Cited

U.S. PATENT DOCUMENTS

| | | |
|---|---|---|
| 5,793,108 | 8/1998 | Nakanishi et al. . |
| 6,087,718 | * 7/2000 | Cho . |
| 6,118,176 | * 9/2000 | Tao et al. . |
| 6,118,184 | * 9/2000 | Ishio et al. . |

* cited by examiner

Primary Examiner—Sheila V. Clark
(74) Attorney, Agent, or Firm—Peter F. Corless; Edwards & Angell, LLP

(57) ABSTRACT

A dual-chip integrated circuit (IC) package is provided, which is characterized in the use of a an extending portion formed from the leads of a leadframe to provide firm support to the bonding pads on the chips. The dual-chip integrated circuit package utilizes a leadframe having a first leads and a second leads, with a spacing being defined between the first and second leads; and the first leads is extended toward the spacing to form the extending portion at a downset position with respect to the second plane where the leadframe positions leads. A first integrated circuit chip is mounted on the extending portion in such a manner that the front side thereof is attached to the extending portion; and a second integrated circuit chip is attached to the first integrated circuit chip in a back-to-back manner. The bonding pads on the two integrated circuit chips are electrically connected to the first and second leads via a plurality of bonding wires. The use of the extending portion for the attachment of the two integrated circuit chips can help prevent delamination of the chips and can provide firm support to the bonding pads on the chips so that the chips can be prevented from being cracked during the wire-bonding process. The manufactured integrated circuit package can therefore be more assured in reliability and quality.

15 Claims, 3 Drawing Sheets

DUAL-CHIP INTEGRATED CIRCUIT PACKAGE WITH A CHIP-DIE PAD FORMED FROM LEADFRAME LEADS

BACKGROUND OF THE INVENTION

1. Field of the Invention

This invention relates to integrated circuit (IC) packages, and more particularly, to a new structure for dual-chip integrated circuit package which is characterized in the use of leads of a leadframe to provide firm support and electrical connection with external devices to the chips.

2. Description of Related Art

Integrated circuit chips are typically packed in packages for easy handling and utilization. To allow increased functionality from a single integrated circuit package, it is usually desired to pack two or more integrated circuit chips rather than just one in the integrated circuit package. An integrated circuit package that packs two integrated circuit chips therein is customarily referred to as a dual-chip integrated circuit package.

The U.S. Pat. No. 5,793,108 discloses a dual-chip integrated circuit package. FIG. 5 is a schematic sectional diagram showing the structure of this dual-chip integrated circuit package. As shown, this dual-chip integrated circuit package includes a leadframe 200 having a die pad 201 for mounting a first integrated circuit chip 220 and a second integrated circuit chip 240. The first integrated circuit chip 220 has its front side 221 attached to the die pad 201 by means of an insulative adhesive film 210. The bonding pads 223 on the first integrated circuit chip 220 are electrically connected via a plurality of gold wires 250 to the first surface 202a of the leads 202 of the leadframe 200. An insulative adhesive layer 230 is then coated on the back side 222 of the first integrated circuit chip 220 for attaching the first integrated circuit chip 220 to the back side 242 of the second integrated circuit chip 240. The bonding pads 243 on the front side 241 of the second integrated circuit chip 240 are electrically connected via a plurality of gold wires 260 to a second surface 202b of the leads 202. Further, an encapsulant 270 is formed to encapsulate the first integrated circuit chip 220, the second integrated circuit chip 240, and the inner part of the leads 202. Electronic components and electric circuits are formed on the front side 221 of the first integrated circuit chip 220 and the front side 241 of the second integrated circuit chip 240.

The forgoing dual-chip integrated circuit package, however, has the following drawbacks. First, it requires the bonding pads 223 on the front side 221 of the first integrated circuit chip 220 to be exposed out of the die pad 201 so as to facilitate the connection of the gold wires 250. This requires the jointed area between the first integrated circuit chip 220 and the die pad 201 to be smaller than the area of the front side 221 of the first integrated circuit chip 220. However, after the second integrated circuit chip 240 has been attached to the first integrated circuit chip 220, the beneath of the bonding pads 243 on the second integrated circuit chip 240 is a void space. As a consequence, as shown in FIG. 6, during the wire-bonding process to connect the bonding wires 260, the second integrated circuit chip 240 is only partly supported by the fixture 280, which would easily cause the areas near the bonding pads 243 on the second integrated circuit chip 240 and the bonding pads 223 on the first integrated circuit chip 220 to be cracked. Second, since the front side 221 of the first integrated circuit chip 220 is attached to the die pad 201 in a direct face-to-face manner, the first integrated circuit chip 220 could be easily subject to delamination during temperature changes in the manufacture process. This is because that the first integrated circuit chip 220 differs in Coefficient of Thermal Expansion (CTE) from the die pad 201. The direct face-to-face attachment also requires the insulative adhesive film 210 to be large enough to cover the whole of the die pad 201. This practice, however, would considerably increase the manufacture cost. Moreover, the insulative adhesive film 210 being made large would hamper the drainage of the air between the insulative adhesive film 210 and the die pad 201 and the air between the insulative adhesive film 210 and the first integrated circuit chip 220, which would undesirably cause voids to be formed therebetween. Under high-temperature condition, the existence of such voids would cause a popcorn effect, which could damage the integrated circuit package structure. Still one drawback is that when the foregoing dual-chip integrated circuit package is formed as a low profile package, the gap between the bottom side of the die pad and the bottom of a cavity of an encapsulation mold (not shown) would become very small, causing the resin flow introduced into the encapsulation mold to be slowed down when passing through the gap, resulting in the undesired thus-forming of voids in the formed encapsulant. The forming of these voids could also lead to the problem of a popcorn effect.

SUMMARY OF THE INVENTION

It is therefore an objective of this invention to provide a dual-chip integrated circuit package, which can help prevent delamination from taking place in the interface between the chips and the leadframe.

It is another objective of this invention to provide a dual-chip integrated circuit package, which can provide firm support to the bonding pads on the chips so that the chips can be prevented from being cracked during the wire-bonding process.

It is still another objective of this invention to provide a dual-chip integrated circuit package, which can be more assured in reliability and quality.

In accordance with the foregoing and other objectives, the invention proposes a new structure for dual-chip integrated circuit package. The dual-chip integrated circuit package of the invention includes: (a) a leadframe having a plurality of first leads and a plurality of second leads, with a spacing being defined between the first and second leads; the first leads each having an extending portion; (b) a first integrated circuit chip having a front side and a back side, with the front side being formed with a plurality of bonding pads; the first integrated circuit chip being attached to the extending portions of the first leads in such a manner that the front side thereof is attached to extending portions, allowing the bonding pads on the first integrated circuit chip to be positioned in the spacing; (c) a second integrated circuit chip having a front side and a back side, with the front side being formed with a plurality of bonding pads; the second integrated circuit chip being attached to the first integrated circuit chip in a back-to-back manner; (d) a plurality of first electric connection means for electrically connecting the bonding pads on the first integrated circuit chip to the second leads of the leadframe; (e) a plurality of second electric connection means for electrically connecting the bonding pads on the second integrated circuit chip to at least one of the first leads and the second leads of the leadframe; and (f) an encapsulant for encapsulating the first integrated circuit chip, the second integrated circuit chip, the first and second electric connection means, and an inner part of the first and second leads of the leadframe.

In the foregoing dual-chip integrated circuit package, the electric connection means can be either gold wires or copper wires. The electric connection of the chip with the leads of the leadframe can also be accomplished by TAB (Tape Automated Bonding) techniques.

It is a characteristic feature of the invention that each of the first leads are extended to form an extending portion, preferably being downset from the plane where the leadframe positions. This downset arrangement of the extending portion can help allow the resin flow use in the molding process to be more evenly distributed, thus preventing the forming of voids in the resulted encapsulant. Further, in order to allow planeness to the extending portion of the first leads, they can be held together by means of insulative adhesive tapes, glues, or the like.

In the case of the two integrated circuit chips being flash memory chips, they are each formed with only one row of bonding pads thereon. In this case, the bonding pads on the first integrated circuit chip are electrically connected to the first leads via first electric connection means; while the bonding pads on the second integrated circuit chip are electrically connected to the second leads via second electric connection means.

In the case of the first integrated circuit chip being a flash memory chip and the second integrated circuit chip being an ASIC chip, the second integrated circuit chip is formed with two rows of bonding pads thereon. In this case, the two rows of bonding pads are respectively electrically connected to the first leads and the second leads; and the bonding pads on the first integrated circuit chip are electrically connected to the second leads

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, three preferred embodiments are disclosed in full details in the following.

First Preferred Embodiment

Figure 1:
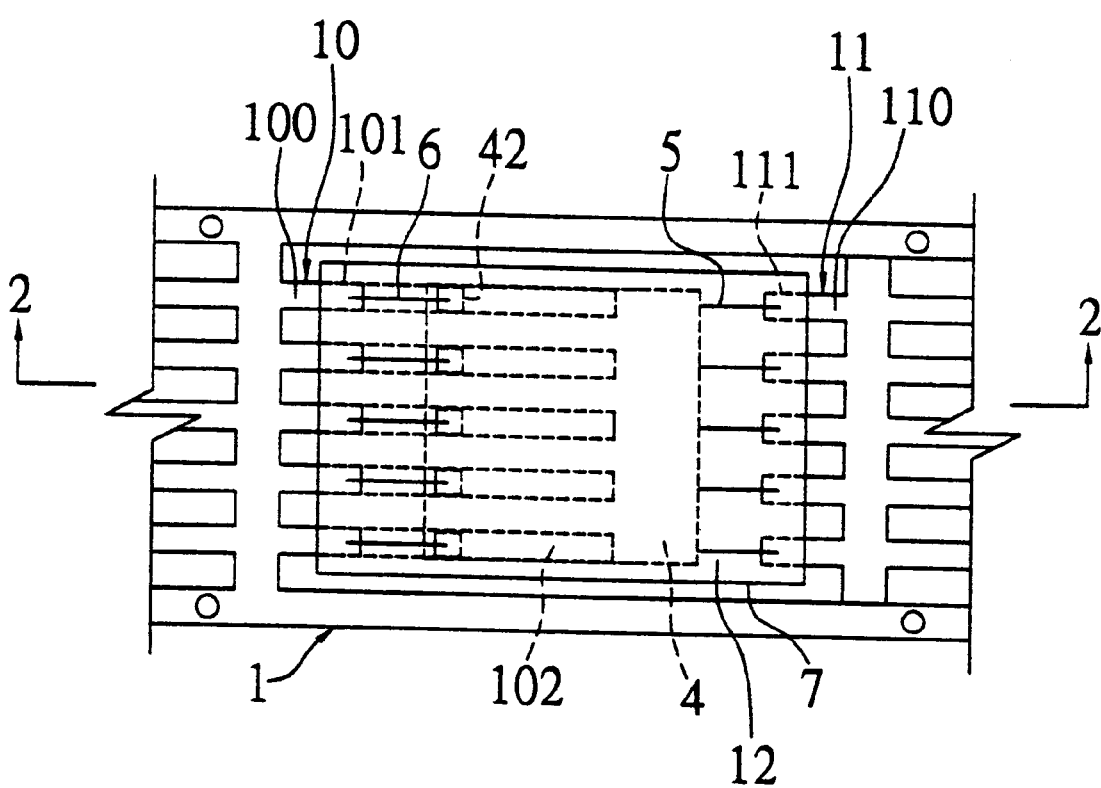
FIG. 1 shows a schematic top view of a first preferred embodiment of the dual-chip integrated circuit package according to the invention.
Figure 2:
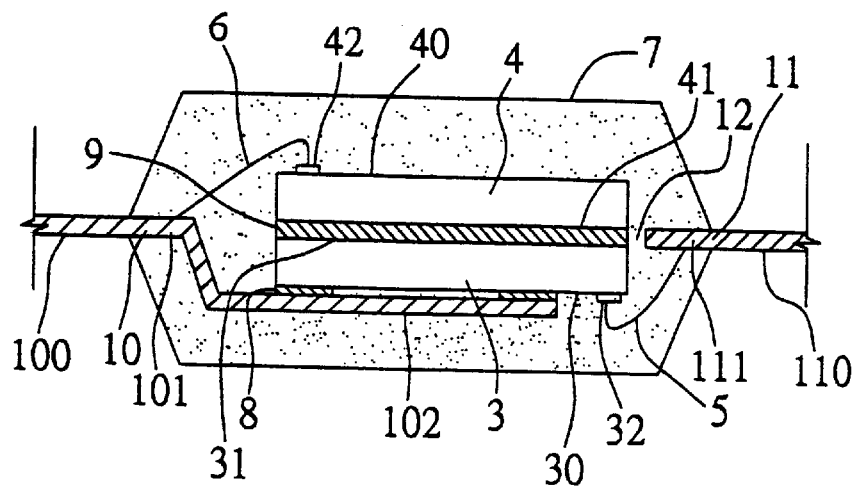
FIG. 2 is a schematic sectional diagram of the dual-chip integrated circuit package of FIG. 1 cutting through the line 2—2.

The first preferred embodiment of the dual-chip integrated circuit package of the invention is disclosed in the following with reference to FIGS. 1–2.

As shown, the dual-chip integrated circuit package of the invention is constructed on a leadframe 1 which is used to mount two integrated circuit chips thereon, including a first integrated circuit chip 3 and a second integrated circuit chip 4. The first integrated circuit chip 3 has a front side 30 and a back side 31, with the front side 30 being formed with electronic components and electric circuits; and similarly, the second integrated circuit chip 4 has a front side 40 and a back side 41, with the front side 40 being formed with electronic components and electric circuits. The leadframe 1 is formed with a plurality of first leads 10 and a plurality of second leads 11 opposite to the first leads 10; and further, a spacing 12 is formed between the first leads 10 and the second leads 11. The first integrated circuit chip 3 is electrically connected via a plurality of first bonding wires 5 to the second leads 11, while the second integrated circuit chip 4 is electrically connected via a plurality of second bonding wires 6 to the first leads 10. These bonding wires 5, 6 can be either gold wires or copper wires; the electric connection between the first integrated circuit chip 3 and the second leads 11 as well as that between the second integrated circuit chip 4 and the first leads 10 can also be implemented by means of TAB (Tape Automated Bonding) techniques. Further, the dual-chip integrated circuit package includes an encapsulant 7 which is formed to encapsulate the first integrated circuit chip 3, the second integrated circuit chip 4, the first bonding wires 5, the second bonding wires 6, and the inner part of the first and second leads 10, 11.

The first leads 10 are defined into an inner part 101, which is to be enclosed in the encapsulant 7, and an outer part 100, which is to be exposed to the outside of the encapsulant 7. Further, as shown in FIG. 2, it is a characteristic feature of the invention that the first leads 10 are downset and extended toward the spacing 12 to form an extending portion 102 for the mounting of the two integrated circuit chips 3, 4. The second leads 11 are also defined into an inner part 111, which is to be enclosed in the encapsulant 7, and an outer part 110, which is to be exposed to the outside of the encapsulant 7.

In the first preferred embodiment, the first integrated circuit chip 3 is a flash memory chip, which is formed with only one row of bonding pads 32 on the front side 30 thereof. The first integrated circuit chip 3 is attached to the extending portion 102 by means of an insulative adhesive film 8 made of non-conductive epoxy or polyimide. Since the jointed area between the first integrated circuit chip 3 and the extending portion 102 is far smaller than that in the prior art (the dual-chip integrated circuit package of U.S. Pat. No. 5,793,108), it can help prevent delamination under a high-temperature condition during subsequent process steps. It is to be noted that the first integrated circuit chip 3 should be mounted in such a manner as to allow the bonding pads 32 to be positioned in the spacing 12 for the purpose of facilitating the subsequent wire-bonding process for electrically connecting the bonding pads 32 to the inner part 111 of the second leads 11.

In this embodiment, the second integrated circuit chip 4 is also a flash memory chip, which is formed with only one row of bonding pads 42 on the front side 40 thereof The second integrated circuit chip 4 is attached to the first integrated circuit chip 3 in a back-to-back manner, with its back side 41 being attached by means of an adhesive tape 9 to the back side 31 of the first integrated circuit chip 3. The adhesive tape 9 can be made of either silver paste or polyimide. It is to be noted that the bonding pads 42 on the second integrated circuit chip 4 should be positioned directly above extending portion 102 so that it can be firmly supported by the extending portion 102. This can prevent the two integrated circuit chips 3, 4 from being cracked during the wire-bonding process for connecting the bonding wires 6 between the bonding pads 42 on the second integrated circuit chip 4 and the first leads 10. Moreover, it can help increase the quality level of the wire bonding.

The insulative adhesive film 8 is made of an elastic material that can provide a buffering effect to the first integrated circuit chip 3, so that the first integrated circuit chip 3 can be prevented from being crashed by the pressure used to attach the second integrated circuit chip 4 onto the back side 31 of the first integrated circuit chip 3 during the die bond process. Further, since the jointed area between the front side 30 of the first integrated circuit chip 3 and the extending portion 102 is smaller than that in the prior art, it allows the utilization of the insulative adhesive film 8 in the dual-chip integrated circuit package of the invention to be very cost-effective. In addition, the use of the insulative adhesive film 8 can help prevent the forming of voids in the jointed part between the first integrated circuit chip 3 and the extending portion 102. The problem of a popcorn effect can thus be prevented when placing the half-manufactured integrated circuit package assembly under a high-temperature process environment. The quality of the manufactured integrated circuit package can thus be more assured.

Next, a wire-bonding process is performed to connect the second bonding wires 6 between the second integrated circuit chip 4 and the first leads 10. After this, a molding process is performed on the half-manufactured integrated circuit package assembly for the formation of the encapsulant 7. During this process, since the first integrated circuit chip 3 is securely mounted on the extending portion 102, which is an extended from the first leads 10, it can prevent the resin flow from causing the two integrated circuit chips 3, 4 to be displaced that would otherwise cause the first bonding wires 5 or the second bonding wires 6 to expose to the outside of the encapsulant 7. The quality of the manufactured integrated circuit package can thus be more assured.

After the molding process is completed, the outer part 100 of the first leads 10 are bent into predefined shape to facilitate the mounting of the manufactured integrated circuit package on a circuit board (not shown). This completes the manufacture of the dual-chip integrated circuit package of the invention.

Second Preferred Embodiment

Figure 3:
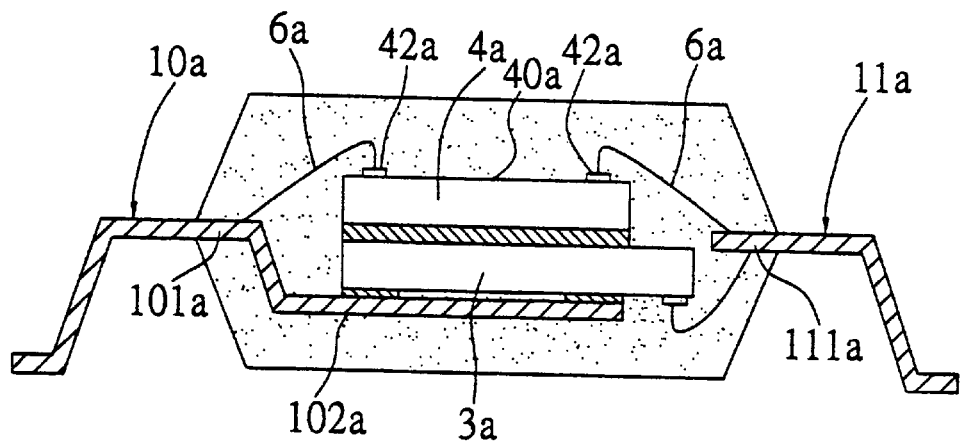
FIG. 3 is a schematic sectional diagram of a second preferred embodiment of the dual-chip integrated circuit package according to the invention.

FIG. 3 is a schematic sectional diagram of the second preferred embodiment of the dual-chip integrated circuit package according to the invention. For distinguishing purpose, the reference numerals in FIG. 3 are appended with the letter "a".

This embodiment is specifically designed for the case of the second integrated circuit chip being an ASIC chip formed with two rows of bonding pads 42a on the front side 40a thereof In this case, all the two rows of bonding pads 42a should be positioned directly above the extending portion 102a so that they can be both firmly supported by the extending portion 102a. One row of the bonding pads 42a is electrically connected to the inner part 101a of the first leads 10a, while the other row is electrically connected to the inner part 101a of the second leads 11a via two sets of bonding wires 6a. Since all the two rows of bonding pads 42a are positioned directly above the extending portion 102a, they can be firmly supported by the extending portion 102a without being cracked during the wire-bonding process to form the bonding wires 6a. The second integrated circuit chip 4a should be smaller in dimension than the first integrated circuit chip 3a in the extending direction of the extending portion 102a so that all the two rows of bonding pads 42a can be positioned directly above the chip-die pad 102a.

Third Preferred Embodiment

Figure 4:
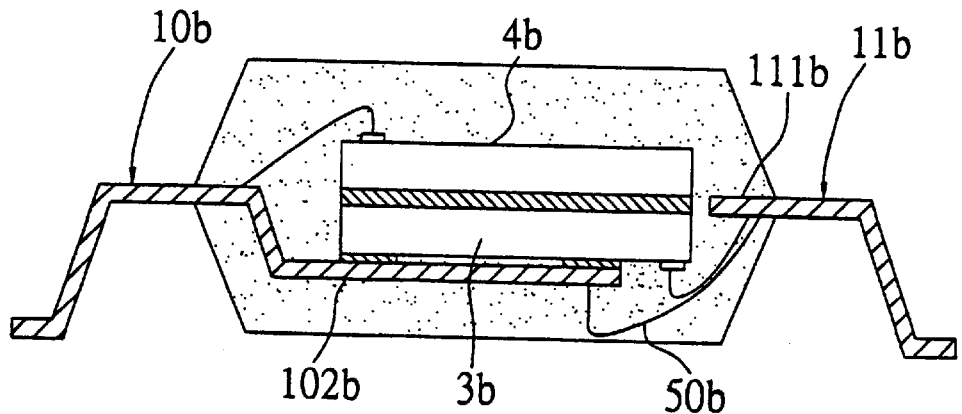
FIG. 4 is a schematic sectional diagram of a third preferred embodiment of the dual-chip integrated circuit package according to the invention.
Figure 5:
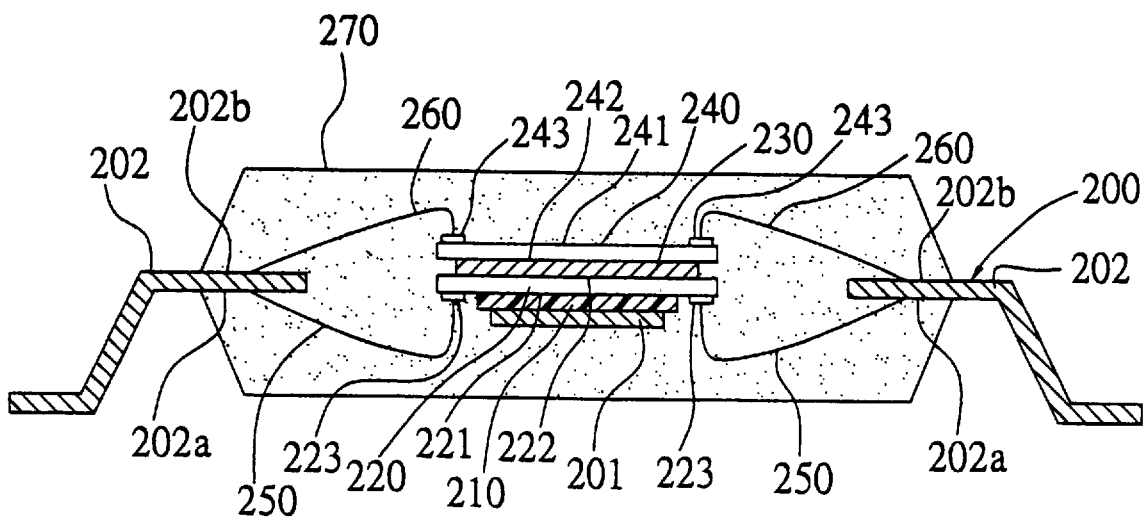
FIG. 5 (PRIOR ART) is a schematic sectional diagram of a conventional integrated circuit package.
Figure 6:
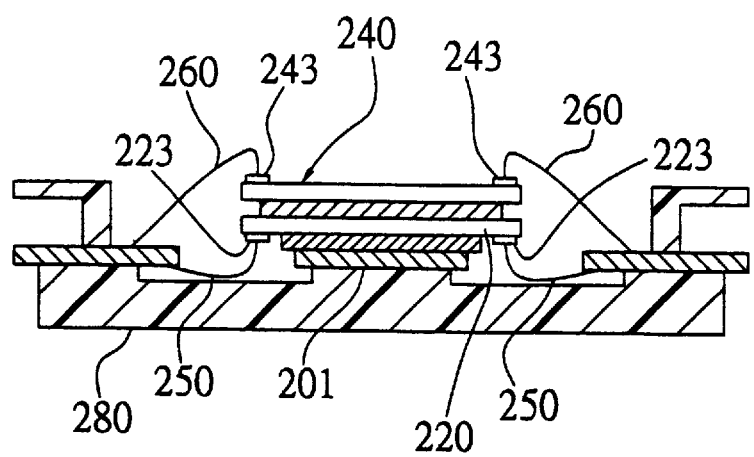
FIG. 6 (PRIOR ART) is a schematic sectional diagram used to depict the mounting of a second integrated circuit chip on the conventional integrated circuit package of FIG. 5.

FIG. 4 is a schematic sectional diagram of the third preferred embodiment of the dual-chip integrated circuit package according to the invention. For distinguishing purpose, the reference numerals in FIG. 4 are appended with the letter "b".

This embodiment is specifically designed for the case of the first integrated circuit chip 3b and the second integrated circuit chip 4b being functionally connected to each other in parallel. In this case, the inner part 111b of the second leads 11b is connected via a third set of bonding wires 50b to the end part of the extending portion 102, allowing the first leads 10 to be electrically connected to the second leads 11b.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual-chip integrated circuit package, which comprises:

a leadframe having a plurality of first leads and a plurality of second leads, with a spacing being defined between the first and second leads; the first leads each having an extending portion wherein said extending portion extends to a length greater than a length of said second leads;

a first integrated circuit chip having a front side and a back side, with the front side being formed with a plurality of bonding pads; the first integrated circuit chip being mounted on the extending portion in such a manner that the front side thereof is attached to the extending portion;

a second integrated circuit chip having a front side and a back side, with the front side being formed with a plurality of bonding pads; the second integrated circuit chip being attached to the first integrated circuit chip in a back-to-back manner;

a plurality of first electric connection means for electrically connecting the bonding pads on the first integrated circuit chip to the second leads of the leadframe;

a plurality of second electric connection means for electrically connecting the bonding pads on the second integrated circuit chip to the first leads of the leadframe; and an encapsulant for encapsulating the first integrated circuit chip, the second integrated circuit chip, the first and second electric connection means, and an inner part of the first and second leads of the leadframe.

2. The dual-chip integrated circuit package of claim 1, further comprising:

a plurality of third electric connection means interconnected between the extending portion and the second leads so as to electrically interconnecting the first leads and the second leads.

3. The dual-chip integrated circuit package of claim 2, wherein the first, second, and third electric connection means are gold wires.

4. The dual-chip integrated circuit package of claim 1, wherein the first integrated circuit chip is attached to the extending portion by means of an insulative adhesive film with elastic property.

5. The dual-chip integrated circuit package of claim 4, wherein the insulative adhesive film is made of polyimide.

6. The dual-chip integrated circuit package of claim 1, wherein the second integrated circuit chip is attached onto the first integrated circuit chip by means of silver paste.

7. The dual-chip integrated circuit package of claim 1, wherein the second integrated circuit chip is attached onto the first integrated circuit chip by means of an insulative adhesive tape.

8. The dual-chip integrated circuit package of claim 7, wherein the insulative adhesive tape is made of epoxy resin.

9. The dual-chip integrated circuit package of claim 1, wherein the extending portion is downset from the plane where the leadframe positions.

10. The dual-chip integrated circuit package of claim 1, wherein in the case of the second integrated circuit chip being formed with two rows of bonding pads, the two rows of bonding pads are positioned directly above the extending portion of the first leads.

11. The dual-chip integrated circuit package of claim 10, wherein one row of the bonding pads are electrically connected to the first leads while the other row of the bonding pads are electrically connected to the second leads.

12. The dual-chip integrated circuit package of claim 11, wherein the extending portion of the first leads are held together by adhesive means to maintain planeness thereto.

13. The dual-chip integrated circuit package of claim 1 wherein the second leads are not downset from the plane where the leadframe is positioned.

14. The dual-chip integrated circuit package of claim 9 wherein the second leads are not downset from the plane where the leadframe is positioned.

15. The dual-chip integrated circuit package of claim 1 wherein the first chip or second chip are not supported by the second leads.

* * * * *